United States Patent
Drissen et al.

[11] Patent Number: 5,717,186
[45] Date of Patent: Feb. 10, 1998

[54] METHOD AND DEVICE FOR CONTROLLING THE ELECTRIC CURRENT DENSITY ACROSS A WORKPIECE DURING HEAT TREATMENT IN A PLASMA

[75] Inventors: Hansjakob Drissen, Bedburg-Hau; Winfried Gräfen, Duisburg; Bernd Edenhofer, Kleve, all of Germany

[73] Assignee: Ipsen Industries International GmbH, Kleve, Germany

[21] Appl. No.: 664,990

[22] Filed: Jun. 13, 1996

[30] Foreign Application Priority Data

Jun. 13, 1995 [DE] Germany ............ 195 21 548.6

[51] Int. Cl.[6] .................................................. B23K 10/00
[52] U.S. Cl. ................... 219/121.54; 219/121.57; 219/121.59; 219/121.52
[58] Field of Search ................ 219/121.54, 121.57, 219/121.59, 121.36, 121.52, 121.43; 313/231.31

[56] References Cited

FOREIGN PATENT DOCUMENTS 3504936  8/1985  Germany.
475366  10/1967  Switzerland.

*Primary Examiner*—Mark H. Paschall
*Attorney, Agent, or Firm*—Robert W. Becker & Associates

[57] ABSTRACT

In a method for controlling the electric current density across a workpiece in a furnace during heat treatment in a plasma an auxiliary electrode with a known surface area is introduced into the furnace. A batch of workpieces is then introduced into the furnace. First a plasma of a neutral gas is generated within the furnace. The total current within the furnace and the current within the auxiliary electrode are measured. The surface area of the workpieces is calculated according to the equation $$F_{CH} = \frac{I_G}{I_{HE}} \times F_{HE} - F_{HE}$$

The auxiliary electrode is then switched off and a material-transmitting plasma is generated. The nominal total electric current for controlling a desired nominal current density is then calculated according to the equation $$I_{Gnominal} = F_{CH} J_{nominal}.$$

The total current is measured in the furnace and is set to the nominal current value.

5 Claims, 1 Drawing Sheet

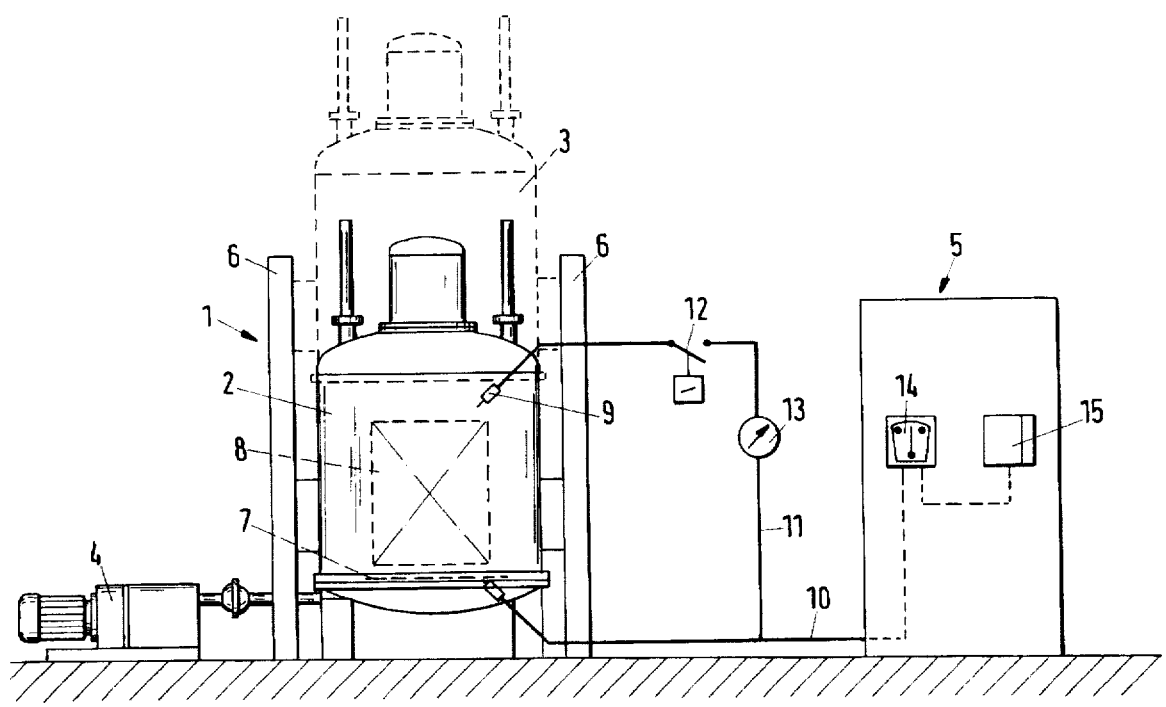

METHOD AND DEVICE FOR CONTROLLING THE ELECTRIC CURRENT DENSITY ACROSS A WORKPIECE DURING HEAT TREATMENT IN A PLASMA

BACKGROUND OF THE INVENTION

The present invention relates to a method for controlling the electric current density across a workpiece during heat treatment in a plasma in connection with the use of an auxiliary electrode with known surface area $F_{HE}$. Furthermore, the invention relates to a device for performing this method.

From Swiss patent 4 75 366 a device for monitoring the electrical behavior of high voltage corona discharge is known. In this known device the supply voltage or the entire device is switched off when the monitoring action shows that the corona discharge is about to change to a detrimental arc discharge which is to be avoided. This is based on the supposition that as long as the ratio of the discharge currents across the workpiece and the auxiliary electrode is identical to the ratio of the surface areas of the workpiece and the auxiliary electrode, no arc discharge can occur. Since during change from a corona discharge into an arc discharge the corresponding discharge current increases and thus the current ratio is changed, this known device uses this change of the current ratio in order to prevent the arc discharge by switching off the supply voltage, respectively, the entire apparatus.

In a gas ion, respectively, plasma surface treatment the resulting surface properties are strongly influenced by the density of the discharge current at the surface of the workpiece so that in addition to protection against a non-uniform discharge, respectively, an arc discharge it is also necessary to measure and control the electric current density across the workpiece to be treated. While the discharge current across the workpiece can be measured and controlled easily, it is difficult to determine the current density across the workpiece because, for determining the current density across the workpiece, the exact surface area must be determined across which the discharge current is actually effective. The determination of the batch surface area is especially very difficult for parts of a complicated design.

From German patent 35 04 936 a device for controlling the discharge current across a workpiece is known in which, in addition to the workpiece batch to be treated, an auxiliary electrode is arranged in the furnace. In order not to calculate or measure the surface area of the batch each time, in this known device the current density is measured within the furnace, i.e., across the batch of workpieces and the auxiliary electrode, and from the known surface area of the auxiliary electrode and the separately measured current through the auxiliary electrode the surface area of the workpiece batch is determined. This measurement of the entire current density within the furnace is performed continuously during the entire plasma coating process. However, during practical tests of this method, it has been shown that, contrary to the theoretical supposition, the discharge current across the batch during the treatment cycle changes even though the auxiliary electrode controls a constant current. Further tests have shown that the surface area of the auxiliary electrode during the plasma treatment process changes which, for example, can be caused by carbon black deposition. These surface changes of the batch are caused by the auxiliary electrode being switched on during the entire plasma coating process in order to measure the total current density within the furnace.

It is therefore an object of the present invention to provide a method for controlling the electric density across a workpiece which allows for a simple and reproducible control of the current density. Furthermore, the invention is concerned with providing a device for performing the method.

SUMMARY OF THE INVENTION

The method for controlling the electric current density across a workpiece in a furnace during heat treatment in a plasma according to the present invention is primarily characterized by the following steps:

a) placing an auxiliary electrode with a known surface area into the furnace;

b) introducing a batch of workpieces into the furnace;

c) generating a plasma of a neutral gas in the furnace;

d) measuring a total current $I_G$ within the furnace and a current $I_{HE}$ within the auxiliary electrode;

e) calculating a surface area $F_{CH}$ of the workpieces according to the equation $$F_{CH} = \frac{I_G}{I_{HE}} \times F_{HE} - F_{HE}$$

f) switching off the auxiliary electrode;

g) generating a material-transmitting plasma;

h) calculating the nominal total electric current $I_{Gnominal}$ for controlling a desired nominal current density $J_{nominal}$ according to the equation $$I_{Gnominal} = F_{CH} \cdot J_{nominal}$$

i) measuring the total current $I_G$ in the furnace and setting $I_G$ to $I_{Gnominal}$.

Preferably, step b) includes selecting the neutral gas from the group of neutral gases consisting of argon, neon, helium and hydrogen.

Advantageously, step g) includes selecting a gas for generating the plasma from the group of gases consisting of nitriding gas, carburizing gas, and a boronizing gas.

The present invention also relates to a device for controlling the electric current density across a workpiece in a furnace during heat treatment in a plasma, wherein the device is primarily characterized by:

A furnace with a furnace chamber and a support for a batch of workpieces;

An auxiliary electrode positioned inside the furnace chamber;

A voltage source for supplying the auxiliary electrode and the support with the same polarity;

A first current measuring device for measuring the total current within the furnace;

A second current measuring device, connected between the first current measuring device and the auxiliary electrode, for measuring the current $I_{HE}$ present at the auxiliary electrode;

A switch for switching off the auxiliary electrode.

Preferably, the device further comprises a control unit coupled to the first current measuring device.

Accordingly, the method of the present invention is primarily characterized by the following steps:

generating a plasma with a neutral gas;

measuring the total current $I_G$ in the furnace as well as the current $I_{HE}$ across the auxiliary electrode;

calculating the surface area of the batch $F_{CH}$ according to the equation $$F_{CH} = \frac{I_G}{I_{HE}} \times F_{HE} - F_{HE}$$

switching of the auxiliary electrode;

generating a material-transmitting plasma;

calculating the total current $I_{Gnominal}$ to be adjusted for controlling the desired current density nominal value $J_{nominal}$ according to the equation $$I_{Gnominal} = F_{CH} \cdot J_{nominal}$$

and measuring the total current $I_G$ in the furnace and adjusting $I_G$ to $I_{Gnominal}$.

In the inventive method the auxiliary electrode is only loaded for a short period of time, and only when a non-material-transmitting plasma is present, for measuring the total current $I_G$ in the furnace. During the subsequent surface treatment process in a material-transmitting plasma the auxiliary electrode, in contrast to the method according to German Patent 35 04 936, remains switched off and thus is not subjected to surface changes during the plasma process. In the inventive method it is thus possible, after calculating the surface area of the batch $F_{CH}$ and without the auxiliary electrode being switched on, to control the current density only by measuring and after-controlling of the total current $I_G$ within the furnace.

The gas for generating the neutral, i.e. non-material-transmitting, plasma, according to a preferred embodiment of the invention is selected from the group of argon, neon, helium, and hydrogen. These gases have the advantage that the plasma generated with them does not interact with the surface of the batch of workpieces, respectively, the auxiliary electrode and thus allow for an error-free, reproducible measurement.

For generating the material-transmitting plasma according to a preferred embodiment of the invention, nitriding, carburizing, or boronizing gases are used.

The inventive solution in regard to an apparatus for performing the method is characterized in that the total current $I_G$ in the furnace is measured with a first current measuring device, and that a second current measuring device is provided between the first current measuring device for the total current $I_G$ and the auxiliary electrode for measuring the current $I_{HE}$ across the auxiliary electrode as well as a switch for switching off the auxiliary electrode are provided.

By providing a switch between the voltage source and the auxiliary electrode, it is possible to supply the auxiliary electrode only for short periods of time with voltage, i.e., for measuring the total current $I_G$ in the neutral plasma. Subsequently, the auxiliary electrode is switched off with the switch. It is thus ensured that during the plasma process no surface changes will occur at the auxiliary electrode.

In a preferred embodiment of the invention the current measuring device for the total current $I_G$ is coupled to a control unit with which an adjustment of the measured value $I_G$ to the calculated value $I_{Gnominal}$ can be performed.

BRIEF DESCRIPTION OF THE DRAWING

The object and advantages of the present invention will appear more clearly from the following specification in conjunction with the accompanying only drawing showing an inventive device for controlling the electric current density in a schematic representation.

DESCRIPTION OF PREFERRED EMBODIMENTS

The present invention will now be described in detail with the aid of a specific embodiment utilizing the only FIGURE.

The represented device is comprised substantially of a furnace 1 with a furnace hood 3 surrounding and enclosing a furnace chamber 2 as well as a vacuum pump 4 for evacuating the furnace chamber 2 and a plasma generator 5 as a high voltage source for producing a plasma in the furnace chamber 2.

For filling and emptying the furnace chamber 2 the furnace hood 3, as is represented in dashed lines, can be moved upwardly along the guide rails 6. Batch supports 7 are positioned within the furnace chamber 2 for receiving batches 8 of workpieces. An auxiliary electrode 9 is also arranged in the furnace chamber 2. The high voltage source serving as a plasma generator 5 is connected via line 10 to the batch support 7. A line 11 is branched off line 10 and is connected to the auxiliary electrode 9. A switch 12 is connected within the line 11 to the auxiliary electrode 9 and a current measuring device 13 for measuring the current $I_{HE}$ across the auxiliary electrode 9 is also provided. For measuring the total current $I_G$ in the furnace 1, when viewed from the plasma generator 5, upstream of the branch of line 11 from the line 10 a current measuring device 14 for measuring the total current $I_G$ in the furnace is provided. In order to be able to control the magnitude of the total current $I_G$ measured with the measuring device 14 to the calculated total current nominal value $I_{Gnominal}$, the current measuring device 14 is connected with a control unit 15.

The function of the aforedescribed device will be explained in more detail with a specific embodiment.

EXAMPLE

A batch with an unknown surface area, comprised of 672 small pinions, was introduced into the furnace chamber 2 of the furnace 1. Subsequently, the furnace 1 was evacuated via vacuum pump 4 and heated to 850° C. The temperature was maintained constant until the entire batch was temperature-equilibrated. After reaching the constant temperature, a hydrogen gas atmosphere of 6 mbar was introduced into the furnace. After closing the switch 12, i.e., after connecting the auxiliary electrode 9 with the plasma generator 5 via the lines 10 and 11, a neutral, i.e., non-material transmitting, plasma was produced by supplying direct voltage of 560 V to the hydrogen gas present within the furnace chamber 2.

With the current measuring device 14 a total current $I_G$ of 27,000 mA was measured in the furnace 1. At the same time, the current measuring device 13 for the current $I_{HE}$ across the auxiliary electrode 9 showed a value 91 mA.

Based on these measured values as well as the known surface area $F_{HE}$ of the auxiliary electrode 9 of 577 cm², the unknown batch surface area $F_{CH}$ could be determined according to the equation $$\frac{I_{HE}}{F_{HE}} = \frac{I_G}{F_{CH} + F_{HE}}$$

after transposing the above equation as follows $$F_{CH} = \frac{I_G}{I_{HE}} \times F_{HE} - F_{HE}$$

Based on the three known values, i.e., the measured current $I_G$ and $I_{HE}$ as well as the known surface area $F_{HE}$ of the auxiliary electrode 9, a value of 170.620 cm² results for the unknown batch surface area $F_{CH}$.

The known current density nominal value $J_{nominal}$ for the plasma process was 0.65 mA/cm².

After measuring the total current $I_G$ in the neutral plasma, the switch 12 was opened to separate the auxiliary electrode 9 from the plasma generator 5. Subsequently, the batch of workpieces 8 was heated to the final temperature and the neutral gas plasma was replaced with a material-transmitting plasma, i.e., a carburizing plasma. In order to be able to control the predetermined current density nominal value $J_{nominal}$ of 0.65 mA/cm², this value was multiplied with the determined batch surface area $F_{CH}$ and the total current $I_{Gnominal}$ was determined as a control parameter according to the following equation $$I_{Gnominal} = J_{nominal} \cdot F_{CH}$$

This calculation resulted in a value of 110,903 mA for the nominal value of the total current density $I_{Gnominal}$ to be adjusted with the control unit 15 at the current measuring device 14.

A separate calculation of the geometric batch surface area resulted in a value of 167.758 cm² which means that the measuring error is less than 2% and that the aforedescribed method is thus suitable to provide exact and reproducible values for the control of the electric current density.

The present invention is, of course, in no way restricted to the specific disclosure of the specification and drawings, but also encompasses any modifications within the scope of the appended claims.

What we claim is:

1. A method for controlling the electric current density across a workpiece in a furnace during heat treatment in a plasma, said method comprising the steps of:
   a) placing an auxiliary electrode with a known surface area $F_{HE}$ into the furnace;
   b) introducing a batch of workpieces into the furnace;
   c) generating a plasma of a neutral gas in the furnace;
   d) measuring a total current $I_G$ within the furnace and a current $I_{HE}$ within the auxiliary electrode;
   e) calculating a surface area $F_{CH}$ of the workpieces according to the equation;

$$F_{CH} = \frac{I_G}{I_{HE}} \times F_{HE} - F_{HE}$$

f) switching off the auxiliary electrode;
   g) generating a material-transmitting plasma;
   h) calculating the nominal total electric current $I_{Gnominal}$ for controlling a desired nominal current density $J_{nominal}$ according to the equation;

$$I_{Gnominal} = F_{CH} \times J_{nominal}$$

i) measuring the total current $I_G$ in the furnace and controlling $I_G$ to be $I_{Gnominal}$.

2. A method according to claim 1, wherein step b) includes selecting the neutral gas from the group of neutral gases consisting of argon, neon, helium, and hydrogen.

3. A method according to claim 1, wherein step g) includes selecting a gas for generating the plasma from the group of gases consisting of a nitriding gas, a carburizing gas, and a boronizing gas.

4. A device for controlling the electric current density across a workpiece in a furnace during heat treatment in a plasma, said device comprising:

a furnace with a furnace chamber and a support for a batch of workpieces;

an auxiliary electrode positioned inside said furnace chamber;

a voltage source for supplying said auxiliary electrode and said support with the same polarity;

a first current measuring device for measuring the total current $I_G$ within the furnace;

a second current measuring device, connected between said first current measuring device and said auxiliary electrode, for measuring the current $I_{HE}$ present at said auxiliary electrode;

a switch for switching off said auxiliary electrode after calculating a surface area $F_{CH}$ of the workpieces according to the equation $$F_{CH} = \frac{I_G}{I_{HE}} \times F_{HE} - F_{HE}$$

and before generating a material-transmitting plasma;

a means for controlling during heat treatment in the material-transmitting plasma the total current $I_G$ to a calculated nominal total electric current $I_{Gnominal}$ for controlling the desired nominal current density $J_{nominal}$ according to the equation $$I_{Gnominal} = F_{CH} \times J_{nominal}$$

5. A device according to claim 4, further comprising a control unit coupled to said first current measuring device.

* * * * *